US010725679B2

(12) United States Patent
Chamness et al.

(10) Patent No.: US 10,725,679 B2
(45) Date of Patent: Jul. 28, 2020

(54) SYSTEMS AND METHODS FOR CALCULATING A PROBABILITY OF EXCEEDING STORAGE CAPACITY IN A VIRTUALIZED COMPUTING SYSTEM

(71) Applicant: Nutanix, Inc., San Jose, CA (US)

(72) Inventors: Mark Albert Chamness, Menlo Park, CA (US); Revathi Anil Kumar, San Jose, CA (US)

(73) Assignee: Nutanix, Inc., San Jose, CA (US)

(*) Notice: Subject to any disclaimer, the term of this patent is extended or adjusted under 35 U.S.C. 154(b) by 3 days.

(21) Appl. No.: 15/909,345

(22) Filed: Mar. 1, 2018

(65) Prior Publication Data

US 2019/0272113 A1    Sep. 5, 2019

(51) Int. Cl.
*G06F 3/06* (2006.01)
*G06F 17/18* (2006.01)
*G06F 9/455* (2018.01)
*H03M 7/30* (2006.01)

(52) U.S. Cl.
CPC .......... *G06F 3/0629* (2013.01); *G06F 3/0604* (2013.01); *G06F 3/067* (2013.01); *G06F 3/0608* (2013.01); *G06F 3/0644* (2013.01); *G06F 3/0659* (2013.01); *G06F 3/0665* (2013.01); *G06F 9/45558* (2013.01); *G06F 17/18* (2013.01); *G06F 3/0641* (2013.01); *G06F 3/0652* (2013.01); *H03M 7/30* (2013.01)

(58) Field of Classification Search
CPC .. G06F 3/0629; G06F 3/0659; G06F 9/45558; G06F 3/0608; G06F 3/0604; G06F 17/18; G06F 3/067; G06F 3/0644; G06F 3/0665; G06F 3/0652; G06F 3/0641; H03M 7/30

USPC .......................................................... 711/170
See application file for complete search history.

(56) References Cited

U.S. PATENT DOCUMENTS

| | | | |
|---|---|---|---|
| 8,549,518 B1 | 10/2013 | Aron et al. | |
| 8,601,473 B1 | 12/2013 | Aron et al. | |
| 8,850,130 B1 | 9/2014 | Aron et al. | |
| 9,021,200 B1* | 4/2015 | Kushmerick | G06F 12/02 711/114 |
| 9,348,538 B2 | 5/2016 | Mallaiah et al. | |
| 9,772,866 B1 | 9/2017 | Aron et al. | |
| 9,946,563 B2 | 4/2018 | Geibel et al. | |
| 10,216,534 B1* | 2/2019 | Dhoolam | G06F 9/45558 |
| 2002/0097716 A1* | 7/2002 | Kumaran | H04L 47/10 370/389 |
| 2010/0115216 A1* | 5/2010 | Jia | H04L 67/1097 711/162 |

(Continued)

OTHER PUBLICATIONS

Poitras, Steven. "The Nutanix Bible" (Oct. 15, 2013), from http://stevenpoitras.com/the-nutanix-bible/ (Publication date based on indicated capture date by Archive.org; first publication date unknown).

(Continued)

*Primary Examiner* — David Yi
*Assistant Examiner* — Zubair Ahmed
(74) *Attorney, Agent, or Firm* — Dorsey & Whitney LLP (57) ABSTRACT

Examples of systems are described for calculating a probability of exceeding storage capacity of a virtualized system in a particular time period using probabilistic models. The probabilistic models may advantageously take variances of storage capacity into consideration.

23 Claims, 5 Drawing Sheets

(56) References Cited

U.S. PATENT DOCUMENTS

| | | |
|---|---|---|
| 2013/0159645 A1 | 6/2013 | Anglin et al. |
| 2013/0179648 A1 | 7/2013 | Yagame et al. |
| 2015/0261665 A1* | 9/2015 | Chamness ............... G06F 12/02 711/162 |
| 2017/0220261 A1 | 8/2017 | Krishnamurthy et al. |
| 2018/0121095 A1 | 5/2018 | Atia et al. |
| 2018/0129524 A1 | 5/2018 | Bryant et al. |
| 2018/0349063 A1 | 12/2018 | Matsushita et al. |

OTHER PUBLICATIONS

Poitras, Steven. "The Nutanix Bible" (Jan. 11, 2014), from http://stevenpoitras.com/the-nutanix-bible/ (Publication date based on indicated capture date by Archive.org; first publication date unknown).
Poitras, Steven. "The Nutanix Bible" (Jun. 20, 2014), from http://stevenpoitras.com/the-nutanix-bible/ (Publication date based on indicated capture date by Archive.org; first publication date unknown).
Poitras, Steven. "The Nutanix Bible" (Jan. 7, 2015), from http://stevenpoitras.com/the-nutanix-bible/ (Publication date based on indicated capture date by Archive.org; first publication date unknown).
Poitras, Steven. "The Nutanix Bible" (Jun. 9, 2015), from http://stevenpoitras.com/the-nutanix-bible/ (Publication date based on indicated capture date by Archive.org; first publication date unknown).
Poitras, Steven. "The Nutanix Bible" (Sep. 4, 2015), from https://nutanixbible.com/.
Poitras, Steven. "The Nutanix Bible" (Jan. 12, 2016), from https://nutanixbible.com/.
Poitras, Steven. "The Nutanix Bible" (Jun. 9, 2016), from https://nutanixbible.com/.
Poitras, Steven. "The Nutanix Bible" (Jan. 3, 2017), from https://nutanixbible.com/.
Poitras, Steven. "The Nutanix Bible" (Jun. 8, 2017), from https://nutanixbible.com/.
Poitras, Steven. "The Nutanix Bible" (Jan. 3, 2018), from https://nutanixbible.com/.
Poitras, Steven. "The Nutanix Bible" (Jun. 25, 2018), from https://nutanixbible.com/.
Poitras, Steven. "The Nutanix Bible" (Jan. 8, 2019), from https://nutanixbible.com/.
NetApp: "Active IQ Unified Manager 9.6 Online Help", May 2019, 638 pages.
NetApp: "Cluster Dashboard", 2019, 2 pages.
NetApp: "Solution Brief NetApp Active IQ Actionable Intelligence for Optimal Data Management", 2019, 2 pages.

* cited by examiner

SYSTEMS AND METHODS FOR CALCULATING A PROBABILITY OF EXCEEDING STORAGE CAPACITY IN A VIRTUALIZED COMPUTING SYSTEM

TECHNICAL FIELD

Examples described herein relate to virtualized systems. Examples of calculating a probability and/or the risk associated with exceeding storage capacity in a virtualized system are described.

BACKGROUND

A virtual machine (VM) generally refers to a software-based implementation of a machine in a virtualization environment, in which the hardware resources of a physical computer (e.g., CPU, memory, etc.) are virtualized or transformed into the underlying support for the fully functional virtual machine that can run its own operating system and applications on the underlying physical resources just like a real computer.

Virtualization generally works by inserting a thin layer of software directly on the computer hardware or on a host operating system. This layer of software contains a virtual machine monitor or "hypervisor" that allocates hardware resources dynamically and transparently. Multiple operating systems may run concurrently on a single physical computer and share hardware resources with each other. By encapsulating an entire machine, including CPU, memory, operating system, and network devices, a virtual machine may be completely compatible with most standard operating systems, applications, and device drivers. Most modern implementations allow several operating systems and applications to safely run at the same time on a single computer, with each having access to the resources it needs when it needs them.

One reason for the broad adoption of virtualization in modern business and computing environments is because of the resource utilization advantages provided by virtual machines. Without virtualization, if a physical machine is limited to a single dedicated operating system, then during periods of inactivity by the dedicated operating system the physical machine may not be utilized to perform useful work. This may be wasteful and inefficient if there are users on other physical machines which are currently waiting for computing resources. Virtualization allows multiple VMs to share the underlying physical resources so that during periods of inactivity by one VM, other VMs can take advantage of the resource availability to process workloads. This can produce great efficiencies for the utilization of physical devices, and can result in reduced redundancies and better resource cost management.

With the amount of data available today, and its exponential growth, managing storage can be an exhaustive task. Companies are building tools for capacity forecasting to avoid operational issues. To address this, many rely on time series forecasting methods to predict full capacity events.

DETAILED DESCRIPTION

Certain details are set forth herein to provide an understanding of described embodiments of technology. However, other examples may be practiced without various of these particular details. In some instances, well-known circuits, control signals, timing protocols, computer system components and/or software operations have not been shown in detail in order to avoid unnecessarily obscuring the described embodiments. Other embodiments may be utilized, and other changes may be made, without departing from the spirit or scope of the subject matter presented here.

Problems may arise with existing storage capacity forecasting methods because trends in capacity are highly unpredictable: customers can delete data, migrate VMs, change their utilization patterns. Quantifying these changes is challenging and often results in inaccurate forecasts. Providing inaccurate forecasts to may reduce confidence in estimates.

Examples described herein focuses not as much on predicting a particular time of storage capacity exhaustion, but rather on calculating a risk of exceeding the storage capacity. This may better track the typical goal of capacity forecasting—to reduce the risk. Examples of probabilistic models described herein may directly calculates the risk (e.g., a probability of exceeding capacity). Different users and/or systems may have different risk preferences. Examples described herein may be used to fit different risk profiles. For example, some examples may tolerate a 10% probability of failure, while others may tolerate only a 1% probability of failure. Moreover, examples described herein may provide more realistic estimates for systems that experience discontinuities in storage utilization. Unlike time series models, examples of models described herein may adapt to changes in behavior.

Examples described herein include a probabilistic model based on stochastic processes. In order to facilitate adapting to changes in behavior, examples of the model may utilize a moving average variance to estimate changes in behavior. This model may quantify the probability a given cluster will run out of capacity within a certain time period. The risk of running out of capacity may be calculated during different time frames in the future.

Figure 1:
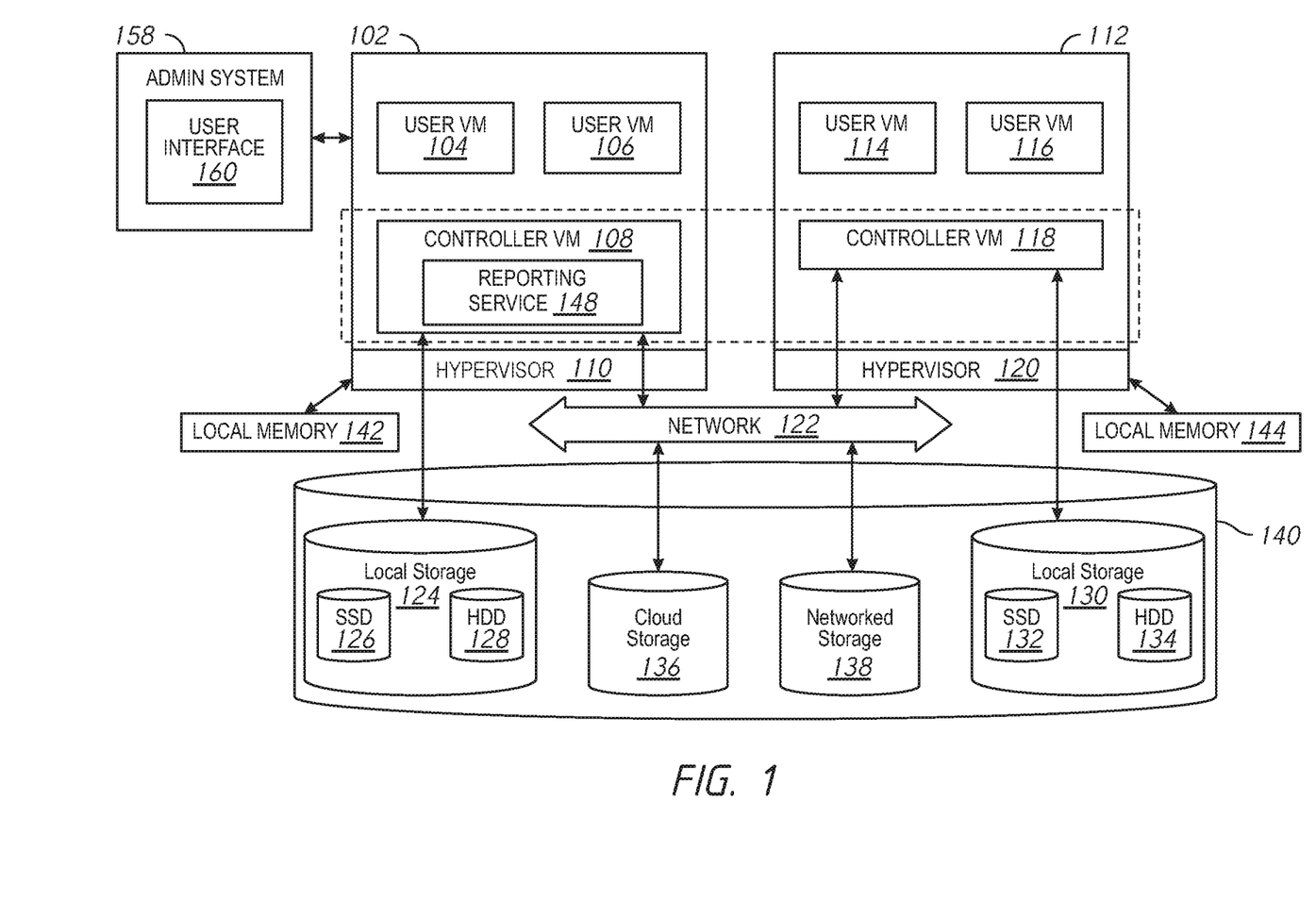
FIG. 1 is a block diagram of a distributed computing system arranged in accordance with embodiments described herein.

FIG. 1 is a block diagram of a distributed computing system, in accordance with embodiments described herein. The distributed computing system of FIG. 1 generally includes computing node 102 and computing node 112 and storage 140 connected to a network 122. The network 122 may be any type of network capable of routing data transmissions from one network device (e.g., computing node 102, computing node 112, and storage 140) to another. For example, the network 122 may be a local area network (LAN), wide area network (WAN), intranet, Internet, or a combination thereof. The network may be a wired network, a wireless network, or a combination thereof.

The storage 140 may include local storage 124, local storage 130, cloud storage 136, and networked storage 138. The local storage 124 may include, for example, one or more solid state drives (SSD 126) and one or more hard disk drives (HDD 128). Similarly, local storage 130 may include SSD 132 and HDD 134. Local storage 124 and local storage 130 may be directly coupled to, included in, and/or accessible by a respective computing node 102 and/or computing node 112 without communicating via the network 122. Other nodes, however, may access the local storage 124 and/or the local storage 130 using the network 122. Cloud storage 136 may include one or more storage servers that may be stored remotely to the computing node 102 and/or computing node 112 and accessed via the network 122. The cloud storage 136 may generally include any type of storage device, such as HDDs SSDs, or optical drives. Networked storage 138 may include one or more storage devices coupled to and accessed via the network 122. The networked storage 138 may generally include any type of storage device, such as HDDs SSDs, and/or NVM Express (NVMe). In various embodiments, the networked storage 138 may be a storage area network (SAN). The computing node 102 is a computing device for hosting virtual machines (VMs) in the distributed computing system of FIG. 1. The computing node 102 may be, for example, a server computer. The computing node 102 may include one or more physical computing components, such as processors.

The computing node 102 is configured to execute a hypervisor 110, a controller VM 108 and one or more user VMs, such as user VMs 104, 106. The user VMs including user VM 104 and user VM 106 are virtual machine instances executing on the computing node 102. The user VMs including user VM 104 and user VM 106 may share a virtualized pool of physical computing resources such as physical processors and storage (e.g., storage 140). The user VMs including user VM 104 and user VM 106 may each have their own operating system, such as Windows or Linux. While a certain number of user VMs are shown, generally any number may be implemented. User VMs may generally be provided to execute any number of applications which may be desired by a user.

The hypervisor 110 may be any type of hypervisor. For example, the hypervisor 110 may be ESX, ESX(i), Hyper-V, KVM, or any other type of hypervisor. The hypervisor 110 manages the allocation of physical resources (such as storage 140 and physical processors) to VMs (e.g., user VM 104, user VM 106, and controller VM 108) and performs various VM related operations, such as creating new VMs and cloning existing VMs. Each type of hypervisor may have a hypervisor-specific API through which commands to perform various operations may be communicated to the particular type of hypervisor. The commands may be formatted in a manner specified by the hypervisor-specific API for that type of hypervisor. For example, commands may utilize a syntax and/or attributes specified by the hypervisor-specific API.

Controller VMs (CVMs) described herein, such as the controller VM 108 and/or controller VM 118, may provide services for the user VMs in the computing node. As an example of functionality that a controller VM may provide, the controller VM 108 may provide virtualization of the storage 140. Accordingly, storage 140 may be referred to as a storage pool. Controller VMs may provide management of the distributed computing system shown in FIG. 1. Examples of controller VMs may execute a variety of software and/or may serve the I/O operations for the hypervisor and VMs running on that node. In some examples, a SCSI controller, which may manage SSD and/or HDD devices described herein, may be directly passed to the CVM, e.g., leveraging PCI Pass-through in some examples. In this manner, controller VMs described herein may manage input/output (I/O) requests between VMs on a computing node and available storage, such as storage 140.

The computing node 112 may include user VM 114, user VM 116, a controller VM 118, and a hypervisor 120. The user VM 114, user VM 116, the controller VM 118, and the hypervisor 120 may be implemented similarly to analogous components described above with respect to the computing node 102. For example, the user VM 114 and user VM 116 may be implemented as described above with respect to the user VM 104 and user VM 106. The controller VM 118 may be implemented as described above with respect to controller VM 108. The hypervisor 120 may be implemented as described above with respect to the hypervisor 110. In the embodiment of FIG. 1, the hypervisor 120 may be a different type of hypervisor than the hypervisor 110. For example, the hypervisor 120 may be Hyper-V, while the hypervisor 110 may be ESX(i). In some examples, the hypervisor 110 may be of a same type as the hypervisor 120.

The controller VM 108 and controller VM 118 may communicate with one another via the network 122. By linking the controller VM 108 and controller VM 118 together via the network 122, a distributed network of computing nodes including computing node 102 and computing node 112, can be created.

Controller VMs such as controller VM 108 and controller VM 118, may each execute a variety of services and may coordinate, for example, through communication over network 122. Services running on controller VMs may utilize an amount of local memory to support their operations. For example, services running on controller VM 108 may utilize memory in local memory 142. Services running on controller VM 118 may utilize memory in local memory 144. The local memory 142 and local memory 144 may be shared by VMs on computing node 102 and computing node 112, respectively, and the use of local memory 142 and/or local memory 144 may be controlled by hypervisor 110 and hypervisor 120, respectively. Moreover, multiple instances of the same service may be running throughout the distributed system—e.g. a same services stack may be operating on each controller VM. For example, an instance of a service may be running on controller VM 108 and a second instance of the service may be running on controller VM 118.

Generally, controller VMs described herein, such as controller VM 108 and controller VM 118 may be employed to control and manage any type of storage device, including all those shown in storage 140 of FIG. 1, including local storage 124 (e.g., SSD 126 and HDD 128), cloud storage 136, and networked storage 138, Controller VMs described herein may implement storage controller logic and may virtualize all storage hardware as one global resource pool (e.g., storage 140) that may provide reliability, availability, and performance. IP-based requests are generally used (e.g., by user VMs described herein) to send I/O requests to the controller VMs. For example, user VM 104 and user VM 106 may send storage requests to controller VM 108 using over a virtual bus. Controller VMs described herein, such as controller VM 108, may directly implement storage and I/O optimizations within the direct data access path. Communication between hypervisors and controller VMs described herein may occur using IP requests.

Note that controller VMs are provided as virtual machines utilizing hypervisors described herein—for example, the controller VM 108 is provided behind hypervisor 110. Since the controller VMs run "above" the hypervisors examples described herein may be implemented within any virtual machine architecture, since the controller VMs may be used in conjunction with generally any hypervisor from any virtualization vendor.

Virtual disks (vDisks) may be structured from the storage devices in storage 140, as described herein. A vDisk generally refers to the storage abstraction that may be exposed by a controller VM to be used by a user VM. In some examples, the vDisk may be exposed via iSCSI ("internet small computer system interface") or NFS ("network file system") and may be mounted as a virtual disk on the user VM. For example, the controller VM 108 may expose one or more vDisks of the storage 140 and the hypervisor may attach the vDisks to one or more VMs, and the virtualized operating system may mount a vDisk on one or more user VMs, such as user VM 104 and/or user VM 106.

During operation, user VMs (e.g., user VM 104 and/or user VM 106) may provide storage input/output (I/O) requests to controller VMs (e.g., controller VM 108 and/or hypervisor 110). Accordingly, a user VM may provide an I/O request over a virtual bus to a hypervisor as an iSCSI and/or NFS request. Internet Small Computer system interface (iSCSI) generally refers to an IP-based storage networking standard for linking data storage facilities together. By carrying SCSI commands over IP networks, iSCSI can be used to facilitate data transfers over intranets and to manage storage over any suitable type of network or the Internet. The iSCSI protocol allows iSCSI initiators to send SCSI commands to iSCSI targets at remote locations over a network. In some examples, user VMs may send I/O requests to controller VMs in the form of NFS requests. Network File system (NFS) refers to an IP-based file access standard in which NFS clients send file-based requests to NFS servers via a proxy folder (directory) called "mount point". Generally, then, examples of systems described herein may utilize an IP-based protocol (e.g., iSCSI and/or NFS) to communicate between hypervisors and controller VMs.

During operation, examples of user VMs described herein may provide storage requests using an IP based protocol, such as SMB. The storage requests may designate the IP address for a controller VM from which the user VM desires I/O services. The storage request may be provided from the user VM to a virtual switch within a hypervisor to be routed to the correct destination. For examples, the user VM 104 may provide a storage request to hypervisor 110. The storage request may request I/O services from controller VM 108 and/or controller VM 118. If the request is to be intended to be handled by a controller VM in a same service node as the user VM (e.g., controller VM 108 in the same computing node as user VM 104) then the storage request may be internally routed within computing node 102 to the controller VM 108. In some examples, the storage request may be directed to a controller VM on another computing node. Accordingly, the hypervisor (e.g., hypervisor 110) may provide the storage request to a physical switch to be sent over a network (e.g., network 122) to another computing node running the requested controller VM (e.g., computing node 112 running controller VM 118).

Accordingly, hypervisors described herein may manage I/O requests between user VMs in a system and a storage pool. Controller VMs may virtualize I/O access to hardware resources within a storage pool according to examples described herein. In this manner, a separate and dedicated controller (e.g., controller VM) may be provided for each and every computing node within a virtualized computing system (e.g., a cluster of computing nodes that run hypervisor virtualization software), since each computing node may include its own controller VM. Each new computing node in the system may include a controller VM to share in the overall workload of the system to handle storage tasks. Therefore, examples described herein may be advantageously scalable, and may provide advantages over approaches that have a limited number of controllers. Consequently, examples described herein may provide a massively-parallel storage architecture that scales as and when hypervisor computing nodes are added to the system.

Examples of controller VMs described herein may provide a variety of services (e.g., may include computer-executable instructions for providing services). Examples of reporting services are described herein, such as reporting service 148 of FIG. 1. A single reporting service 148 is shown in FIG. 1, although multiple controller VMs in a system may provide reporting services (e.g., the controller VM 118 may also have a reporting service). In some examples, one instance of the reporting service (e.g., reporting service 148) may serve as a "lead" service and may provide coordination and/or management of the service across a system (e.g., across a cluster).

Reporting services described herein may provide information about a system (e.g., a cluster). For example, reporting services such as reporting service 148 may provide diagnostic system data which may be used to deliver contextual pro-active, context-aware support. In some examples, reporting services may collect only basic system-level information for monitoring the cluster—personal or other user data may not be collected. Examples of information about the system which may be collected by reporting services described herein include system alerts, cluster information (e.g., number and/or identity of nodes in a cluster), software version (e.g., controller VM 108 version and/or operating system version on computing nodes such as computing node 102), processes and Controller VM information (e.g., identity of controller VM 108 and/or identity of other services provided by controller VM 108), hypervisor details such as type and version (e.g., of hypervisor 110 and/or hypervisor 120), system-level statistics (e.g., network traffic metrics, storage I/O metrics, storage pool capacity), configuration information (e.g., SMTP configuration information and/or NTP configuration information), a storage pool list (e.g., identity, number and/or capacity of storage devices in a storage pool, such as storage 140, utilized capacity of the storage pool, and/or timestamp), container information, disk status, data store information, disk list, domain fault tolerance states, default gateway, and/or a key list (e.g., an SSH key list).

Examples described herein may make particular use of a storage pool list provided by reporting services described herein. The storage pool list may include comprising the utilized capacity of the storage pool and a time at which the utilized capacity was recorded (e.g., a timestamp). In examples described herein, the utilized capacity of the storage pool over time may be utilized together with a probabilistic model to calculate a probability the storage pool will reach capacity in a next time interval (e.g., within a particular time such as 1 week, 1 day, etc.).

Reporting services described herein may query one or more disks in a storage pool (e.g., in storage 140 of FIG. 1). The disks may themselves support diagnostic services which provide statistics regarding disk capacity and utilized storage capacity of the disk. In this manner, reporting services may query one or more disks in the storage pool (e.g., all the disks) and combine the reported statistics to generate a utilized storage capacity and total storage capacity of the storage pool (e.g., utilized storage capacity and total storage capacity of a cluster).

In some examples, reporting services described herein may not gather or communicate information about user VMs, user data, metadata, administrator credentials, identification data (e.g., IP addresses, hostnames) or private information (e.g., passwords, keys, and the like). This may avoid or reduce a need for special protections to be taken in the communication and/or processing of data collected by reporting services to preserve privacy.

Reporting services described herein may collect data on a periodic basis. Different types of data may be collected with different frequencies. In some examples, how often data is collected and/or communicated from the reporting service may vary depending on how often data changes or is expected to change, in some example, reporting services described herein may collect data at collection time intervals of 10 minutes or less. In other examples, the collection time interval may be 9 minutes or less, 8 minutes or less, 5 minutes or less, 2 minutes or less, or 1 minute or less. Other collection time intervals may be used in other examples. Information about the system may be stored at the collection time intervals, e.g., in the storage 140 and/or local memory 142. In some examples, information about the system may be reported by reporting services described herein to other components in communication with the computing node. For example, the reporting service 148 may provide information about the system to one or more administrative systems, e.g. admin system 158 of FIG. 1. The information may be provided at reporting time intervals, which may be equal to the collection time intervals in some examples. In other examples, other reporting time intervals may be used. For example, reporting services may provide information about the cluster every 10 minutes or less in some examples, 9 minutes or less in some examples, 5 minutes or less in some examples, 2 minutes or less in some examples, or 1 minute or less in some examples. Other reporting time intervals may be used.

Examples of reporting services described herein may generate and/or provide system alerts. Alerts generally include basic information—e.g., a copy of the alerting event with one or more variables which identify the event type, description of the problem event (e.g., Power Supply down), and when it has occurred. An alert may also provide the cluster ID, NOS/AOS version, and Controller VM IP address. An alert may be provided, for example, to admin system 158, and a support case may be created responsive to receipt of the alert. After the case is created, various actions may be taken, such as dispatching a service professional to troubleshoot and diagnose the cause of the alert.

Examples of systems described herein may include one or more administrator systems, such as admin system 158 of FIG. 1. The administrator system may be implemented using, for example, one or more computers, servers, laptops, desktops, tablets, mobile phones, or other computing systems. In some examples, the admin system 158 may be wholly and/or partially implemented using one of the computing nodes of a distributed computing system described herein. However, in some examples (such as shown in FIG. 1), the admin system 158 may be a different computing system from the virtualized system and may be in communication with a CVM of the virtualized system (e.g., controller VM 108 of FIG. 1) using a wired or wireless connection (e.g., over a network).

Administrator systems described herein may host one or more user interfaces, e.g., user interface 160. The user interface may be implemented, for example, by displaying a user interface on a display of the administrator system. The user interface may receive input from one or more users (e.g., administrators) using one or more input device(s) of the administrator system, such as, but not limited to, a keyboard, mouse, touchscreen, and/or voice input. The user interface 160 may provide input to controller VM 108 and/or may receive data from the controller VM 108 (e.g., from the reporting service 148). The user interface 160 may be implemented, for example, using a web service provided by the controller VM 108 or one or more other controller VMs described herein. In some examples, the user interface 160 may be implemented using a web service provided by controller VM 108 and information from controller VM 108 (e.g., from reporting service 148) may be provided to admin system 158 for display in the user interface 160.

Administrator systems may have access to (e.g., receive data from and/or provide data to) any number of clusters, including a single cluster or multiple clusters. In the example of FIG. 1, the admin system 158 may receive data from the reporting service 148 about the system (e.g., the cluster) shown in FIG. 1, including the utilized capacity of storage 140 over time.

Administrator systems described herein may utilize the reported utilized capacity of a storage pool (e.g., storage 140) over time and a probabilistic model to calculate a probability of exceeding the storage capacity of the storage pool during a next time interval. Probabilistic models may be used which incorporate a probability distribution of various outcomes—such as exceeding the storage capacity of the storage pool. Examples of probabilistic models may be based on stochastic processes. In some examples, a Brownian motion model with drift may be used. In this manner, examples described herein may consider the utilized capacity of a storage pool to be at least partially a random process which may fluctuate up and/or down rather than behaving in a deterministic manner. In this manner, examples of probabilistic models described herein may be responsive to discontinuities in the utilized capacity. Accordingly, examples described herein may calculate a probability of exceeding the storage capacity, rather than a particular time or date on which the storage capacity will be exceeded. This may allow actions to be taken when a probability of exceeding the storage capacity becomes higher than desired. The probability of exceeding the storage capacity may be a probability of exceeding the storage capacity in a particular time interval (e.g., within the next 1 minute in some examples, 1 day in some examples, 1 week in some examples, 10 days in some examples, one month in some examples). Other intervals may be used in other examples. Accordingly, a calculated probability of 90 percent may refer to a 90 percent chance that the storage capacity will be exceeded in the next 10 days.

In some examples, the probabilistic model may utilize a moving average variance of the utilized capacity. For example, utilized capacity (e.g., an amount of used storage) may be reported by one or more reporting services, such as reporting service 148 of FIG. 1, at multiple times. An average may be taken of the utilized capacity at multiple reported times, and the variance of the values over time may be used in the probabilistic model to calculate the probability of exceeding the storage capacity.

Admin systems described herein may perform a comparison of the calculated probability of exceeding storage capacity with a predetermined threshold probability. The predetermined threshold probability may be a probability corresponding to a limit on an acceptable risk for the system. For example, a user, admin, or other process, may determine an acceptable risk of exceeding storage capacity within a certain time period, and the predetermined threshold probability may be set accordingly. The predetermined threshold probability may be stored in memory or other storage accessible to the admin system. The comparison may indicate that the risk of exceeding the storage capacity exceeds the acceptable risk (e.g., the probability of exceeding the storage capacity equals and/or exceeds the predetermined threshold probability). For example, if the predetermined threshold probability is 90 percent, that may indicate that action should be taken to avoid exceeding storage capacity when the calculated probability of doing so exceeds 90 percent. Any of a variety of values may be used for the predetermined threshold probability, such as 95 percent, 90 percent, 85, percent, 80 percent, or other values. In some examples, the predetermined threshold probability may be set by a user, admin, or other process, and may be changed. The predetermined threshold probability may also be varied based on the type or function of the system (e.g., higher priority data and/or critical system may utilize a lower predetermined threshold probability than lower priority data and/or systems). The predetermined threshold probability may be varied based on time. For example, a higher predetermined threshold probability may be utilized on a weekend or other holiday time to reduce spurious notifications to personnel. In some examples, a lower predetermined threshold probability may be utilized on a weekend or other holiday time to increase confidence that a notification would be provided given personnel may not be as closely monitoring the system.

Admin systems described herein may take a variety of actions based on the calculated probability of exceeding storage capacity and/or the comparison of the calculated probability with the predetermined threshold probability. In some examples, an alert may be provided based on the comparison and/or based on the calculated probability. The alert may include a visual, audible, tactile alert and/or communication method. For example, the admin system may send a communication (e.g., phone call, email, text message or other communication) to a predetermined address or ID to provide an alert that the calculated probability of exceeding storage capacity had reached and/or exceeded a certain level.

In some examples, the admin system may take any of a variety of actions based on the calculated probability of exceeding storage capacity and/or the comparison of the calculated probability with the predetermined threshold probability. For example, the admin system may recommend and/or cause a cluster to be expanded, such as by adding one or more computing nodes. In some examples, the admin system may alter operation of one or more of the computing nodes in a system when the probability of exceeding storage capacity exceeds the predetermined threshold probability and/or otherwise indicates that action is desirable. In some examples, the admin system may communicate with one or more of the computing nodes to activate one or more features intended to improve storage availability. Such features may include, but are not limited to, data compression, data de-duplication, data deletion, and/or snapshot deletion. For example, when the calculated probability of exceeding storage capacity meets and/or exceeds the predetermined threshold probability, the admin system 158 of FIG. 1 may communicate with the computing node 112 and/or computing node 102 (e.g., with controller VM 108 and/or controller VM 118). The communication may cause the controller VM 108 and/or controller VM 118 to activate features intended to improve storage availability, and may affect the storage in storage 140. In some examples, the admin system itself may take action on the storage 140 to improve storage availability (e.g., to perform data compression or other actions).

Figure 2:
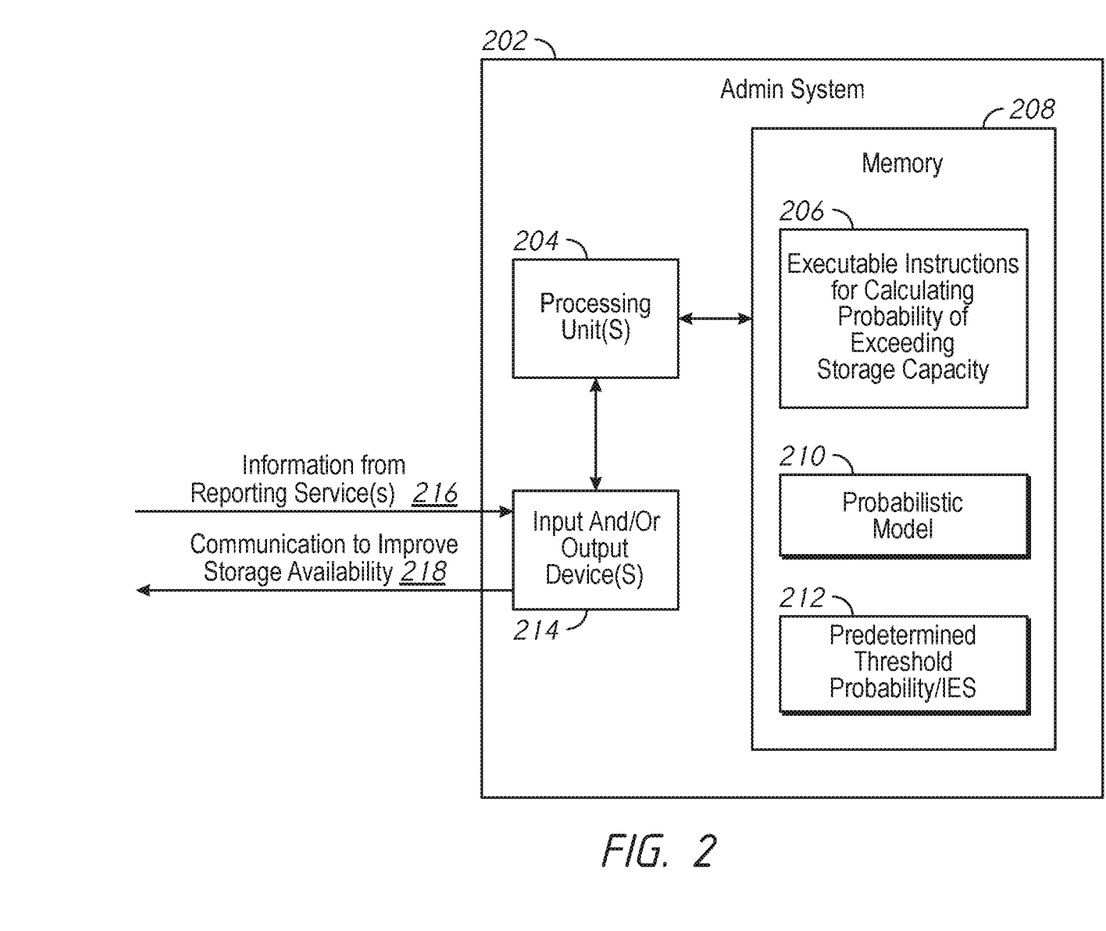
FIG. 2 is a schematic illustration of an admin system arranged in accordance with examples described herein.

FIG. 2 is a schematic illustration of an admin system arranged in accordance with examples described herein. The admin system 202 may include processing unit(s) 204, memory 208, and/or input and/or output device(s) 214. The memory 208 may store executable instructions for calculating probability of exceeding storage capacity 206, probabilistic model 210, and/or predetermined threshold probability/lies 212. The admin system 202 may be implemented using and/or may be used to implement admin systems described herein, such as admin system 158 of FIG. 1.

In some examples, the admin system 202 may be implemented using a computing node of a virtualized system described herein (e.g., computing node 102 and/or computing node 112 of FIG. 1). In some examples, the admin system 202 may be in communication with one or more virtualized systems (e.g., one or more clusters). The admin system 202 may be implemented using, for example, a server computer, although other computing devices may also be used.

Processing unit(s) 204 may be implemented using one or more processors, including single, dual-, and/or quad-core processors. In some examples processing unit(s) 204 may be wholly or partially implemented using custom circuitry (e.g., one or more application specific integrated circuits (ASICs) and/or one or more field programmable gate arrays (FPGAs)).

The memory 208 may be implemented using generally any number and type of computer-readable media, including but not limited to read only memory (ROM), random access memory (RAM), solid state drives (SSDs), disk drives, or other electronic storage. While executable instructions for calculating probability of exceeding storage capacity 206, probabilistic model 210, and predetermined threshold probability/ies 212 are shown as all stored in memory 208 of FIG. 2, in other examples, those instructions and/or data may be provided on separate memories and/or distributed across multiple memories. The memory 208 and/or other memories accessible to the admin system 202 may store additional executable instructions in some examples, such as executable instructions for comparison and/or for altering operation of one or more computing nodes in a virtualized system.

Input and/or output device(s) 214 may be implemented using any number and/or type of input and/or output devices including, but not limited to, one or more keyboards, mice, displays, touchscreens, communication interface(s), network interface(s), or combinations thereof.

During operation, the admin system 202 may receive information from reporting service(s) 216. The information from reporting service(s) 216 may include, for example, information from reporting service 148 of FIG. 1. The information from reporting service(s) 216 may include a storage pool list including a utilized capacity of a storage pool and a time ID. The utilized capacity of the storage pool may include, for example, an amount of storage used (or another indicator thereof such as amount of free storage). The time ID may be a timestamp or other indicator of time. The information from reporting service(s) 216 may include storage pool lists from multiple times such that information about the available storage capacity of a storage pool over time is provided to the admin system 202. For example, storage capacity for a number (n) of time periods may be provided in some examples, and a total capacity at the nth time period may also be provided. The tune periods may be hour(s), day(s), week(s), or another period. For example, storage capacity for a number of days may be provided, together with a total capacity at a last day. In some examples, the data may be provided by reporting services without necessarily having a request for the data (e.g., the data may be "pushed" to an admin system described herein). In some examples, the data may be requested.

For example, if a given cluster has returned data for 47 days, storage capacity for 47 days may in one example be requested by an admin system using a software command such as:

pulse$storage_tib_used

Where "pulse" may refer to a name of the reporting service or dataset and the command may request the total amount of storage used in a storage pool. Storage_tib_used is the name of the field received from the reporting service. The above command may return an amount of used storage on each of the last 47 days, which may be as reported below where each numerical value represents utilized storage capacity on a particular day. The numbers in brackets represent certain days—so [1] is followed by the utilized storage capacity on day one, then day two, then day three, etc. and [14] is followed by the utilized storage capacity on day fourteen, etc.

[1] 0,0000 0.0000 0.0000 0.0000 0.0000 0.0000 0.0000 0.0000 0,0000 0.0306 0.0306 0.0662 0.729

[14] 0.0727 0.0706 0.0704 2.3625 3.8133 3.8278 3.8318 3.7972 3.7978 3.7996 3.8034 3.8655

[27] 5.4757 7.5983 7.4518 7.5336 7.6053 7.6272 7.6385 7.6649 7.6818 7.6946 7.7346 7.7672 7.7816

[40] 7.7983 7.8232 7.8447 7.9119 7.9377 7.9665 7.9810 7.9959

The total capacity on the $47^{th}$ day may be requested using the following command:

pulse$storage_tib_total[nrow(pulse.dt.all)]

Accordingly, the total storage capacity may be returned as:

[1] 20.2508

In this manner, reporting services described herein may provide utilized storage capacity over time, and may provide a total storage capacity at a last time (e.g., at a current time). This reported information may be used to calculate a risk of exceeding storage capacity.

The information from reporting service(s) 216 may be received at input and/or output device(s) 214 (e.g., at a network or other communication interface). The processing unit(s) 204 may execute executable instructions for calculating probability of exceeding storage capacity 206 to calculate a probability of exceeding the storage capacity of the storage pool given the information received in information from reporting service(s) 216 regarding the utilized capacity of the storage pool over time. The executable instructions for calculating probability of exceeding storage capacity 206 may cause the processing unit(s) 204 to utilize one or more probabilistic models, such as probabilistic model 210. The probabilistic model may relate probabilities of exceeding storage pool capacity within a time interval to known historical information regarding storage pool utilization.

For example, a sample code simulation to compute the probability that a cluster will run out of capacity in the next 90 days may be written as follows.

A probability model based on stochastic processes may be used to compute the probability, and may use a Brownian motion with drift estimate. This may be written as

```
p.max = function(y.max, t, s2, mu) {
    exp(2*y.max*mu/s2)*(1-pnorm((y.max+mu*t)/(sqrt(s2*t)))) +
        (1-pnorm((y.max-mu*t)/(sqrt(s2*t))))
}
``` p.max may refer to the probability that the storage capacity equals or exceeds a particular threshold (e.g., a 'max'). The probability is given by a function of four variables—y.max, t, s2, and mu. The variable y.max is the utilized storage at the current time and/or last measured time (e.g., on the nth day). In some examples, a fifth variable may also be used, y.start, which may be the utilized storage at a first measured time (e.g., on the $1^{st}$ day), however in some examples, y.start may be assumed to be zero. The variable $s^2$ refers to the variance, the variable mu refers to the drift estimate, and the variable t refers to the time period in which the probability of running out of capacity will be calculated (e.g., 90 days). The function of those four variables is written in pseudocode above, and may also be represented by the following equation:

$$P(M(t) \geq y) = e^{2y\mu/\sigma^2} \Phi\left(\frac{\mu t + y}{\sigma\sqrt{t}}\right) + \Phi\left(\frac{y - \mu t}{\sigma\sqrt{t}}\right)$$

In the above equation, M(t) may refer to the utilized capacity at time t, and y may refer to a total capacity for a cluster. Accordingly, the left-hand side of the above equation refers to the probability that the utilized capacity at a particular time exceeds the total capacity for the cluster.

In the above equation, mu (e.g., $\mu$) refers to the drift estimate of the utilized storage capacity over time, and the variance (e.g., $\sigma$ or $\sigma^2$) refers to the computed moving average variance of the utilized storage capacity over time. Values are obtained from a normal distribution, e.g., $\Phi$, which is reflected in the pseudocode above as pnorm.

In some examples the function may be defined as follows:

$$\overline{\Phi}(x) = 1 - \Phi(x) = P(Z > x)$$

where Z is a standard normal random variable and $\Phi$ is its distribution function.

Accordingly, one example of a probabilistic model based on stochastic processes (e.g., one utilizing a Brownian motion with drift model) has been described with an equation and a sample code snippet.

Examples of admin systems described herein may compute the probability of running out of storage capacity for each of multiple clusters. For each cluster, the variables may be acquired for running the probabilistic model (e.g. y.start (storage on first day), y.max (storage on nth day), $\sigma^2$ (variance), mu (drift estimate), and/or t (time period that cluster runs out of capacity). Based on the variables, the probability of exceeding the storage capacity in a particular time period (e.g., within 30, 60, and/or 90 days) may be calculated.

In some examples, when additional information from reporting service(s) 216 is received at subsequent times, the processing unit(s) 204 may again execute executable instructions for calculating probability of exceeding storage capacity 206 to re-calculate a probability of exceeding the storage capacity. In this manner, variance in available capacity over time may be taken into consideration in the calculation. The calculation is accordingly flexible, such that it may be modified and updated with changes in available and/or utilized capacity of a storage pool.

The memory 208 may further include other executable instructions (e.g., executable instructions for comparison and/or altering operation of one or more computing nodes). The processing unit(s) 204 may accordingly execute further instructions to compare a calculated probability of exceeding storage capacity in a time interval with a predetermined threshold probability, which may be stored in memory 208 or in another memory accessible to processing unit(s) 204. As described herein multiple predetermined threshold probability/ies 212 may be stored, as different ones may be used for different clusters, different times, and/or different types of data. The processing unit(s) 204 may execute instructions in some examples to alter operation of one or more computing nodes based on the calculated probability of exceeding storage capacity and/or based on a comparison of the calculated probability with a predetermined threshold probability.

The admin system 202 may accordingly provide communication to improve storage availability 218. The communication may include an alert and/or one or more communications intended to alter operation of one or more computing nodes to improve storage availability. For example, commands may be provided to one or more computing nodes to delete data, delete snapshots, compress data, and/or de-duplicate data. The communication to improve storage availability 218 may be provided, for example, to one or more controller VMs of a computing node in a virtualized system. In other examples the communication to improve storage availability 218 may include an alert which may be provided to one or more users for acting to improve storage availability (e.g., using phone, email, and/or text message).

Figure 3A:
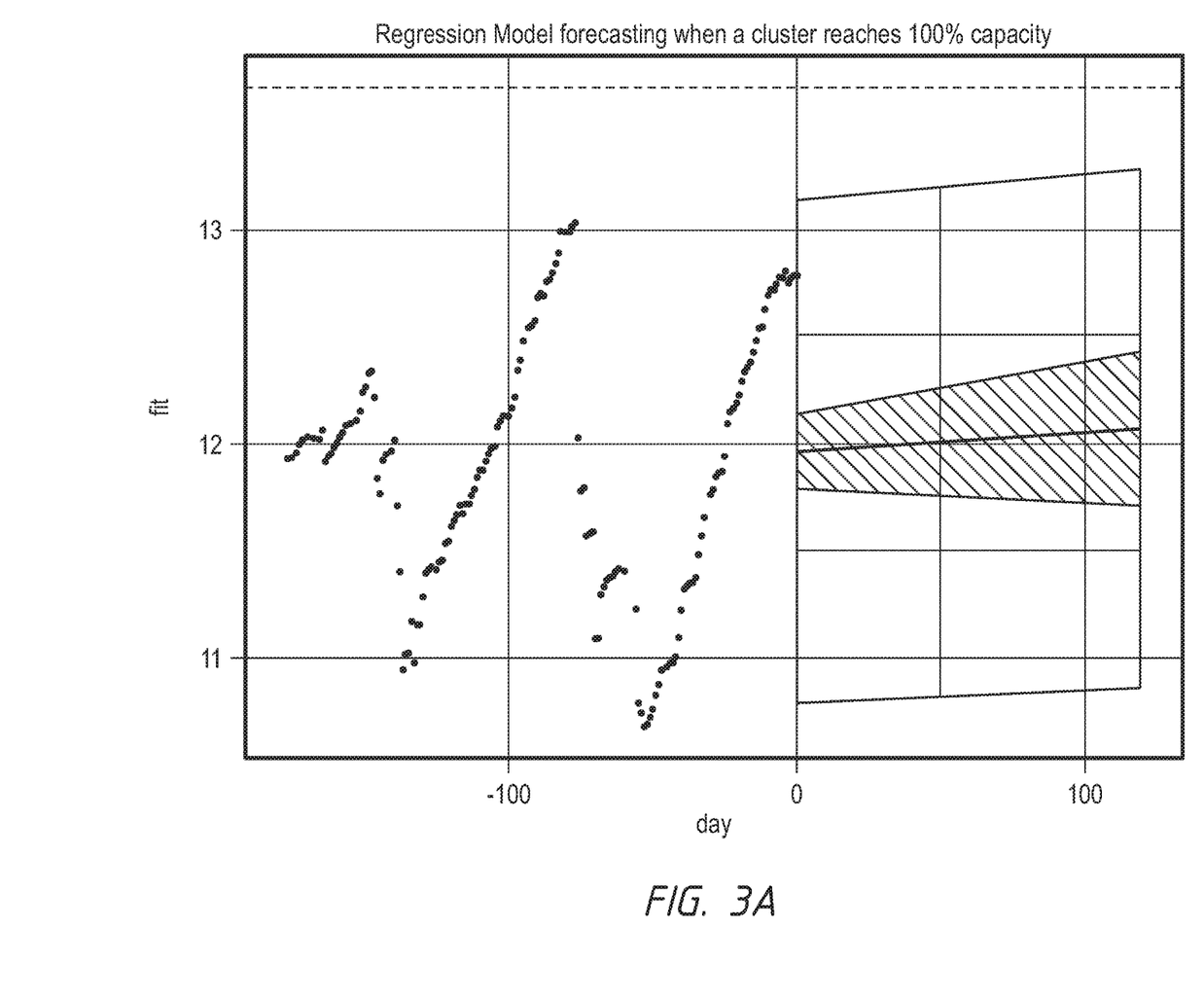
FIG. 3A and FIG. 3B include graphs illustrating an effect of utilizing probabilistic models arranged in accordance with examples described herein.
Figure 3B:
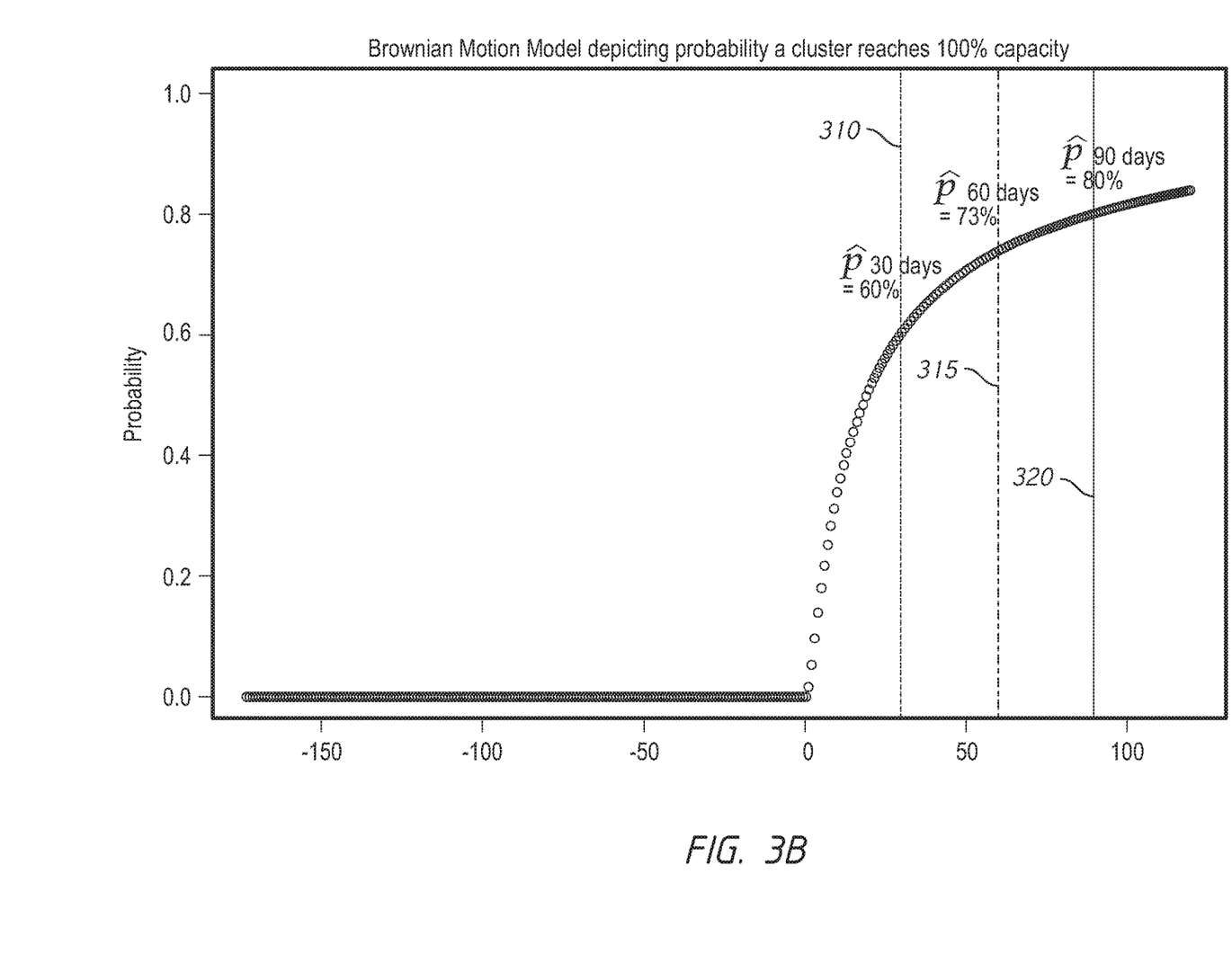

FIG. 3 includes graphs illustrating an effect of utilizing probabilistic models arranged in accordance with examples described herein. FIG. 3A is an illustration of utilized storage capacity over time and a prediction utilizing a linear regression. The cluster whose utilized storage capacity is depicted has what may be considered erratic behavior—e.g., utilized storage capacity increases and decreases over time. The points shown in FIG. 3A prior to day '0' represent utilized storage capacity as reported by a reporting service described herein. Note that the utilized storage capacity has significant fluctuation over time. The linear increasing line and cone shown after day '0' illustrated the predicted utilized storage capacity after day '0' as calculated by a linear regression model. The linear regression does not take into account variances in capacity over time, and accordingly, the regression model depicts that the cluster is unlikely to run out of capacity in the near future even though, considering past performance, the cluster had reached almost 90% of utilization twice—as shown in the data points prior to day '0' in FIG. 3A. Accordingly, linear regression models may not function to accurately reflect a risk of exceeding storage capacity.

Probabilistic models based on stochastic processes as described herein may be able to more accurately reflect risk of exceeding storage capacity, particularly in clusters where storage utilization may fluctuate. FIG. 3B is an illustration of utilized storage capacity over time and a Brownian motion model of probabilities that the storage capacity will be exceeded at a particular time. The graph of FIG. 3B illustrates probability over time. The model finds a 60 percent probability of exceeding storage capacity at day 30 (e.g., time 310 in FIG. 3B), a 73 percent probability of exceeding storage capacity at day 60 (e.g., time 315 in FIG. 3B), and an 80 percent probability of exceeding storage capacity at day 90 (e.g., time 320 in FIG. 3B). In this manner, the risk of exceeding storage capacity may be more accurately reflected by the Brownian motion model depicted in FIG. 3B than by the linear regression of FIG. 3A.

Figure 4:
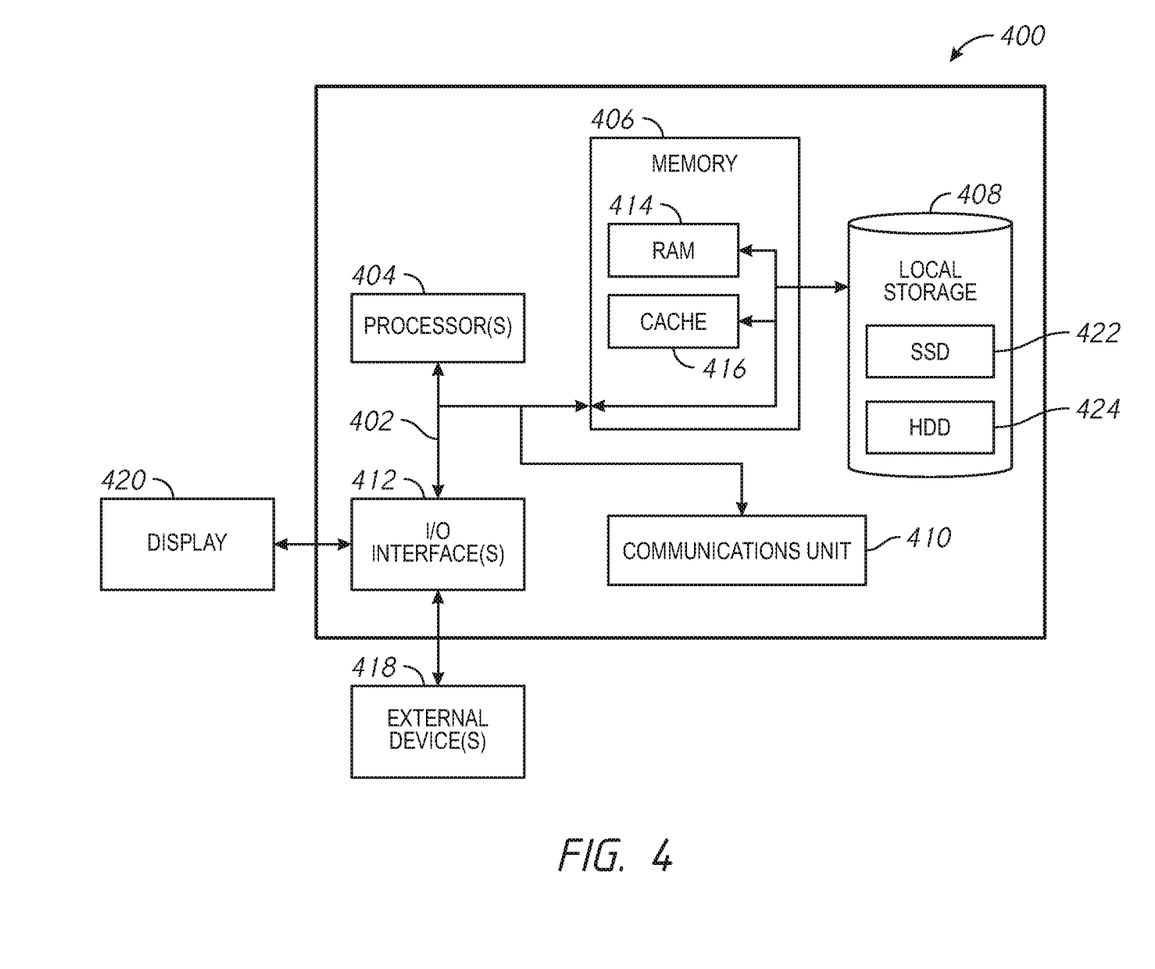
FIG. 4 is a block diagram of components of a computing node in accordance with examples described herein.

FIG. 4 depicts a block diagram of components of a computing node 400 in accordance with examples described herein. It should be appreciated that FIG. 4 provides only an illustration of one implementation and does not imply any limitations with regard to the environments in which different embodiments may be implemented. Many modifications to the depicted environment may be made. The computing node 400 may implemented as the computing node 102 and/or computing node 112.

The computing node 400 includes a communications fabric 402, which provides communications between one or more processor(s) 404, memory 406, local storage 408, communications unit 410, I/O interface(s) 412. The communications fabric 402 can be implemented with any architecture designed for passing data and/or control information between processors (such as microprocessors, communications and network processors, etc.), system memory, peripheral devices, and any other hardware components within a system. For example, the communications fabric 402 can be implemented with one or more buses.

The memory 406 and the local storage 408 are computer-readable storage media. In this embodiment, the memory 406 includes random access memory RAM 414 and cache 416. In general, the memory 406 can include any suitable volatile or non-volatile computer-readable storage media. The local storage 408 may be implemented as described above with respect to local storage 124 and/or local storage 130. In this embodiment, the local storage 408 includes an SSD 422 and an HDD 424, which may be implemented as described above with respect to SSD 126, SSD 132 and HDD 128, HDD 134 respectively.

Various computer instructions, programs, files, images, etc, may be stored in local storage 408 for execution by one or more of the respective processor(s) 404 via one or more memories of memory 406. In some examples, local storage 408 includes a magnetic HDD 424. Alternatively, or in addition to a magnetic hard disk drive, local storage 408 can include the SSD 422, a semiconductor storage device, a read-only memory (ROM), an erasable programmable read-only memory (EPROM), a flash memory, or any other computer-readable storage media that is capable of storing program instructions or digital information.

The media used by local storage 408 may also be removable. For example, a removable hard drive may be used for local storage 408. Other examples include optical and magnetic disks, thumb drives, and smart cards that are inserted into a drive for transfer onto another computer-readable storage medium that is also part of local storage 408.

Communications unit 410, in these examples, provides for communications with other data processing systems or devices. In these examples, communications unit 410 includes one or more network interface cards. Communications unit 410 may provide communications through the use of either or both physical and wireless communications links.

I/O interface(s) 412 allows for input and output of data with other devices that may be connected to computing node 400. For example, I/O interface(s) 412 may provide a connection to external device(s) 418 such as a keyboard, a keypad, a touch screen, and/or some other suitable input device. External device(s) 418 can also include portable computer-readable storage media such as, for example, thumb drives, portable optical or magnetic disks, and memory cards. Software and data used to practice embodiments of the present invention can be stored on such portable computer-readable storage media and can be loaded onto local storage 408 via I/O interface(s) 412. I/O interface(s) 412 also connect to a display 420.

Display 420 provides a mechanism to display data to a user and may be, for example, a computer monitor.

From the foregoing it will be appreciated that, although specific embodiments have been described herein for purposes of illustration, various modifications may be made while remaining with the scope of the claimed technology.

Examples described herein may refer to various components as "coupled" or signals as being "provided to" or "received from" certain components. It is to be understood that in some examples the components are directly coupled one to another, while in other examples the components are coupled with intervening components disposed between them.

Similarly, signal may be provided directly to and/or received directly from the recited components without intervening components, but also may be provided to and/or received from the certain components through intervening components.

What is claimed is:

1. A system comprising:
   a storage pool configured for use by multiple computing nodes; and
   an admin system configured to:
      receive data regarding utilized capacity of the storage pool at multiple times,
      determine a probability of exceeding storage capacity of the storage pool in a next time interval based on a Brownian motion with drift model, and
      cause at least one of the multiple computing nodes to alter operation when the probability of exceeding storage capacity exceeds a threshold probability.

2. The system of claim 1, wherein the admin system is further configured to determine the probability based on a moving average variance of the utilized capacity.

3. The system of claim 1, wherein the admin system is further configured to determine the probability responsive to discontinuities in the utilized capacity.

4. The system of claim 1, wherein said altering operation comprises activating data compression, activating data de-duplication, deleting data, deleting snapshots, or combinations thereof.

5. The system of claim 1, wherein the multiple computing nodes comprise a cluster and wherein a controller virtual machine of at least one of the multiple computing nodes is configured to provide a reporting service, the reporting service configured to provide information about the cluster including a storage pool list comprising the utilized capacity of the storage pool and a time recorded.

6. The system of claim 5, wherein the admin system is configured to receive the information about the cluster and utilize the information in the Brownian motion with drift model.

7. The system of claim 1, wherein the Brownian motion with drift model includes a random process in which the utilized capacity of the storage pool at multiple times vary in a non-deterministic manner.

8. The system of claim 1, wherein the Brownian motion with drift model comprises a stochastic process.

9. At least one non-transitory computer readable media encoded with executable instructions which, when executed by at least one processing unit, cause a system to:
   receive data regarding utilized capacity of a storage pool at multiple times during operation of a virtualized system, the virtualized system comprising multiple computing nodes configured to access the storage pool;
   determine a probability of exceeding storage capacity of the storage pool in a next time interval based on a Brownian motion with drift model; and
   causing at least one of the multiple computing nodes to altering operation when the probability of exceeding storage capacity exceeds a threshold probability.

10. The at least one computer readable media of claim 9, wherein the system is configured to determine the probability based on a moving average variance of the utilized capacity.

11. The at least one computer readable media of claim 9, further cause the system to determine the probability responsive to discontinuities in the utilized capacity.

12. The at least one computer readable media of claim 9, wherein said altering operation comprises activating data compression, activating data de-duplication, deleting data, deleting snapshots, or combinations thereof.

13. The at least one computer readable media of claim 9, wherein the multiple computing nodes comprise a cluster and wherein a controller virtual machine of at least one of the multiple computing nodes is configured to provide a reporting service, the reporting service configured to provide information about the cluster including a storage pool list comprising the utilized capacity of the storage pool and a time recorded.

14. The at least one computer readable media of claim 13, wherein the executable instructions further cause the system to receive the information about the cluster and utilize the information in the Brownian motion with drift model.

15. The at least one computer readable media of claim 9, wherein the Brownian motion with drift model includes a random process in which the utilized capacity of the storage pool at multiple times vary in a non-deterministic manner.

16. The at least one computer readable media od claim 9, wherein the Brownian motion with drift model comprises a stochastic process.

17. A method comprising:
    receiving data regarding utilized capacity of a storage pool at multiple times, the storage pool configured for use by multiple computing nodes,
    determining a probability of exceeding storage capacity of the storage pool in a next time interval based on a Brownian motion with drift model, and
    causing at least one of the multiple computing nodes to alter operation when the probability of exceeding storage capacity exceeds a threshold probability.

18. The method of claim 17, wherein determining the probability is based on a moving average variance of the utilized capacity.

19. The method of claim 17, wherein determining the probability is responsive to discontinuities in the utilized capacity.

20. The method of claim 17, wherein said altering operation comprises activating data compression, activating data de-duplication, deleting data, deleting snapshots, or combinations thereof.

21. The method of claim 17, wherein determining the probability of exceeding storage capability comprises receiving information about a cluster comprising the multiple computing nodes determining the probability based at least on the received information, wherein the information about the cluster includes a storage pool list comprising the utilized capacity of the storage pool and a time recorded.

22. The method of claim 17, wherein the Brownian motion with drift model includes a random process in which the utilized capacity of the storage pool at multiple times vary in a non-deterministic manner.

23. The method of claim 17, wherein the Brownian motion with drift model comprises a stochastic process.

* * * * *